United States Patent
Béland

(10) Patent No.: US 7,787,838 B2
(45) Date of Patent: Aug. 31, 2010

(54) INTEGRATED CIRCUIT, AND AN ARRANGEMENT AND METHOD FOR INTERCONNECTING COMPONENTS OF AN INTEGRATED CIRCUIT

(75) Inventor: Paul Béland, Gatineau (CA)

(73) Assignee: 4472314 Canada Inc., Ottawa, Ontario (CA)

( * ) Notice: Subject to any disclaimer, the term of this patent is extended or adjusted under 35 U.S.C. 154(b) by 1349 days.

(21) Appl. No.: 10/425,950

(22) Filed: Apr. 30, 2003

(65) Prior Publication Data
US 2004/0021497 A1   Feb. 5, 2004

Related U.S. Application Data

(60) Provisional application No. 60/376,204, filed on Apr. 30, 2002.

(51) Int. Cl.
*H01Q 11/12* (2006.01)

(52) U.S. Cl. .......... 455/127.1; 455/333; 455/82; 455/313; 257/754; 257/503; 257/779; 257/782; 257/784; 257/786; 257/700; 257/698; 257/724; 257/528; 257/48; 257/728; 327/356; 327/359; 342/131; 342/372

(58) Field of Classification Search .......... 455/127.2, 455/333, 230.1, 313, 82; 257/48, 503, 779, 257/782, 784, 786, 700, 698, 724, 499, 528, 257/728; 330/307, 65–68, 295; 327/356, 327/359; 342/131, 372
See application file for complete search history.

(56) References Cited

U.S. PATENT DOCUMENTS

| | | | | |
|---|---|---|---|---|
| 4,461,041 A | * | 7/1984 | Dobrovolny | 455/328 |
| 4,494,077 A | * | 1/1985 | Fukaya et al. | 330/295 |
| 4,696,536 A | * | 9/1987 | Albares et al. | 385/14 |
| 5,155,570 A | * | 10/1992 | Tomizuka et al. | 257/501 |
| 5,528,769 A | * | 6/1996 | Berenz et al. | 455/333 |
| 5,590,412 A | * | 12/1996 | Sawai et al. | 455/82 |
| 5,942,766 A | * | 8/1999 | Frei | 257/48 |
| 5,951,893 A | * | 9/1999 | Bitko et al. | 219/209 |
| 6,169,410 B1 | * | 1/2001 | Grace et al. | 324/754 |
| 6,362,777 B1 | * | 3/2002 | Kawakami et al. | 342/131 |
| 6,441,783 B1 | * | 8/2002 | Dean | 342/372 |
| 6,480,013 B1 | * | 11/2002 | Nayler et al. | 324/754 |

(Continued)

OTHER PUBLICATIONS

*Application Note: Creating Microstrip Foot Prints* http://www.ivex.com/techsupport/appnotes/winboard_creating_microstrip_modules.shtml.

(Continued)

*Primary Examiner*—Edward Urban
*Assistant Examiner*—Junpeng Chen

(57) ABSTRACT

A monolithic substrate contains an integrated circuit comprising an amplifier having input and output, a mixer and a hybrid coupler for coupling the amplifier to the mixer. Metallic pads on the substrate are connected to each of two ports of the coupler and separate metallic pads are also connected to each of the input and output of the amplifier. The metallic pads allow the amplifier and mixer to be separately tested by a probe and the input or the output of the amplifier to be selectively connected to the mixer to enable the circuit to operate either as a receiver or transmitter. Alternatively, connections between the mixer and both input and output of the amplifier may be preformed and one of the connections subsequently severed depending on whether the circuit is to operate in receive or transmit mode.

67 Claims, 11 Drawing Sheets

U.S. PATENT DOCUMENTS

| | | | |
|---|---|---|---|
| 6,627,992 B2* | 9/2003 | Ammar | 257/728 |
| 6,993,313 B2* | 1/2006 | Castillejo et al. | 455/333 |
| 6,998,708 B2* | 2/2006 | Ammar | 257/724 |
| 2002/0110942 A1* | 8/2002 | Moghe et al. | 438/26 |
| 2003/0015767 A1* | 1/2003 | Emrick et al. | 257/528 |

OTHER PUBLICATIONS

*Fodel® Dielectric Improves Performance and Cost-Effectiveness of Lange Coupler.* http://www.dupont,com/mcm/applic/H-84338.html.
*Overview of Gallium Arsenide MMIC Processes—J.G. Summers and L.A. NG Thow Hing* GEC Journal of Research, vol. 4, No. 2, 1986.
Stephen A. Maas "Microwave Mixers" —Second Edition, Artech House 1993, p. 249-255.
*17.0-27.0 GHz GaAs MMIC Receiver—XR1000* http://www.mimixbroadband.com/PDFfiles/xr1000.pdf.
*A Novel 3V, 7mA PHEMT GaAs Active MMIC Mixer/LNA for Wireless Applications Henrik Morkner, Mike Frank, Bryan Ingram* Hewlett-Packard, CMCD R&D, 39201 Cherry Street, MS 830 NK 10, Newark, CA 94560.
*A Highly Compact, Wideband GaAs HEMT X—Ku Band Image-Reject Receiver MMIC R. Katz, M.V. Aust, R. Kasody, H. Wang, B. Allen, G.S. Dow, K. Tan, S. Luh, R. Myers* TRW, Electronics Technology Division, One Space Park, Redondo Beach, CA. 90278.
Application Note: Creating Microstrip Foot Prints http://www.ivex.com/techsupport/appnotes/winboard_creating_microstrip_modules.shtml, Printed Nov. 8, 2001 7 pages, Version 1.00 published Aug. 1996; Version 1.01 published Jul. 1998.
Fodel® Dielectric Improves Performance and Cost-Effectiveness of Lange Coupler, DuPont Microcircuit Materials http://www.dupont.com/mcm/applic/H-84338.html Printed Nov. 8, 2001, 2 pages, Copyright 2001.
J.G. Summers and L.A. NG Thow Hing, Overview of Gallium Arsenide MMIC Processes, GEC Journal of Research, pp. 104-113, vol. 4, No. 2, 1986.
Stephen A. Maas, "Microwave Mixers" —Second Edition, Artech House, Inc. 1993, pp. 249-255.
17.0-27.0 GHz GaAs MMIC Receiver—XR1000 http://www.mimixbroadband.com/PDFfiles/xr1000.pdf pp. 1-5, May 20, 2004.
Henrik Morkner, Mike Frank, Bryan Ingram, A Novel 3V, 7mA PHEMT GaAs Active MMIC Mixer/LNA for Wireless Applications, Hewlett-Packard, CMCD R&D, 39201 Cherry Street, MS 830 NK 10, Newark, CA 94560 pp. 527-530, 1995 IEEE MTT-S Digest.
R. Katz, M.V. Aust, R. Kasody, H. Wang, B. Allen, G.S. Dow, K. Tan, S. Lub, R. Myers, A Highly Compact, Wideband GaAs HEMT X—Ku Band Image-Reject Receiver MMIC, TRW, Electronics Technology Division, One Space Park, Redondo Beach, CA. 90278 pp. 131-134, IEEE 1993 Microwave and Millimeter-Wave Monolithic Circuits Symposium.

* cited by examiner

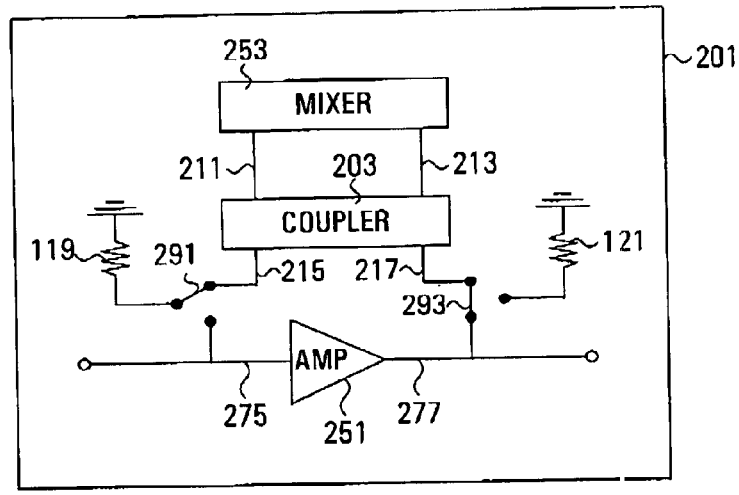
FIG. 12
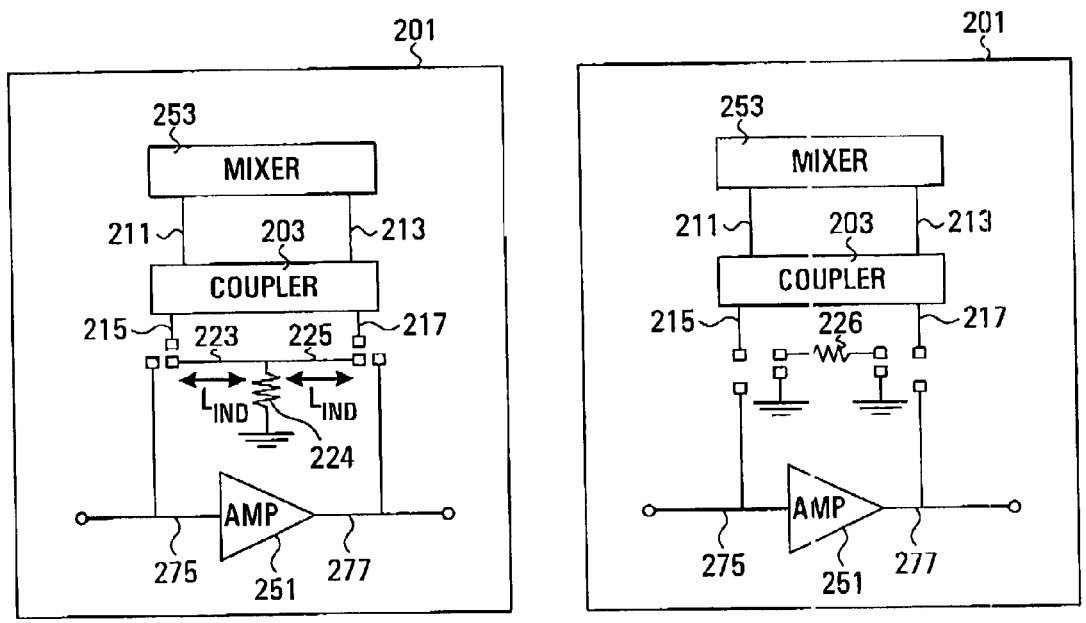
FIG. 13
FIG. 14

INTEGRATED CIRCUIT, AND AN ARRANGEMENT AND METHOD FOR INTERCONNECTING COMPONENTS OF AN INTEGRATED CIRCUIT

This application claims priority from U.S. Provisional Application No. 60/376,204 filed on Apr. 30, 2002.

The present invention relates to an arrangement and method for interconnecting components of an integrated circuit, and in particular, but not limited to an arrangement and method for interconnecting a microwave amplifier and mixer formed on an MMIC chip.

BACKGROUND OF THE INVENTION

In receiver circuits for microwave wireless communication systems, the low noise RF amplifier and mixer circuits may be formed on a single integrated circuit chip in order to simplify production and reduce costs. An example of a monolithic integrated active mixer/low noise amplifier (LLA) is described in IEEE MTT-SDigest (1995), pages 527 to 530, "A Novel 3V, 7 mA PHEMT GaAs active MMIC Mixer/LNA for Wireless Applications", Henrik Morkner, Mike Frank, and Bryan Ingram. The circuit elements include pseudomorphic high electron mobility transistor (PHEMT) structures, formed using molecular beam epitaxy (MBE). The mixer/LLA is designed to operate over a frequency range of 900 MHz to 2,400 MHz, and the output of the amplifier is connected to the mixer through impedance matching circuitry, provided externally of the IC (i.e. off chip) to allow flexibility in selecting appropriate impedance matching circuitry for the desired operating frequency. External impedance matching circuitry is also provided for the intermediate frequency (IF) and local oscillator (LO) ports of the mixer and the RF input of the amplifier. Fabricating the mixer/LLA circuitry using a GaAs PHEMT provides enhanced gain and noise figure performance at low DC levels, but is inherently more expensive than silicon or regular GaAs fabrication techniques. Therefore, the provision of external impedance matching for each of the amplifier and mixer ports assist in minimizing the die area required for the receiver circuitry and minimizing cost.

Another example of an integrated MMIC receiver includes a pair of mixers coupled to the amplifier by a hybrid coupler to provide image rejection of the input RF frequency. The hybrid coupler is formed on the MMIC chip and splits the output signal from the amplifier into in-phase and quadrature RF signals which are fed to the image-reject mixers for mixing with a local oscillator signal. Examples of integrated receiver circuits having an image-reject mixer are disclosed in IEEE Microwave and Millimetre Wave Monolithic Circuits Symposium 1993, "A Highly Compact Wideband GaAs HEMT X-Ku Band Image-Reject Receiver MMIC, R. Katz et al, pages 131 to 134, and in "MIMIX Broadband, 17.0 to 27.0 GHz GaAs MMIC Receiver" at www.mimixbroadband.com.

As mentioned above, GaAs is preferred over silicon for integrated MMIC circuits, but the fabrication process is more expensive. Another drawback of GaAs fabrication is that it generally produces a lower yield of usable devices, which also leads to a higher cost of the end product.

SUMMARY OF THE INVENTION

According to one aspect of the present invention, there is provided a method of forming an integrated circuit, comprising performing one or more processing steps to form at least partially an integrated circuit including an amplifier and a mixer, selecting one of a coupling from the mixer to an input of the amplifier, and a coupling from the mixer to an output of the amplifier based on the structure resulting from at least one of the processing steps, and arranging a coupling from the mixer to the selected one of the input and the output of the amplifier.

According to this process, the mixer and amplifier may be coupled to function either as a transmitter, if the mixer is connected to the input of the amplifier, or as a receiver, if the mixer is coupled to the output of the amplifier. Small variations in the processes involved in fabricating the amplifier and mixer may result in an amplifier/mixer combination which is better suited to a transmitter function than to a receiver function or vice versa, or may result in an amplifier/mixer combination which is only suitable for one of a transmitter and receiver function. In contrast to known fabrication techniques, in which the function of the amplifier/mixer combination either as a receiver or transmitter, and therefore their interconnection, is predetermined before the fabrication process begins, in the present process, the interconnection between the mixer and amplifier is selected after processing has commenced and is based on one or more characteristics of the structure resulting from one or more processing steps. Thus, where for example, an amplifier/mixer combination is either less suitable, or unsuitable for a receiver function, but is suitable for a transmitter function, the process allows an appropriate interconnection between the amplifier/mixer combination to be made resulting in a higher yield of usable dies, and thereby significantly reducing their cost.

In one embodiment, the method further comprises the step of determining at least one characteristic of at least one of the amplifier and the mixer resulting from the processing steps, and selecting the coupling based on the characteristic(s). In one embodiment, the step of determining at least one characteristic of the amplifier and/or mixer comprises testing the performance of at least one of the amplifier and mixer.

One embodiment of the method further comprises forming at least one region of metallic material coupled to the amplifier for contact with a testing apparatus. In one embodiment, at least one region is arranged to enable the amplifier to be tested independently of the mixer. Advantageously, this region may also be used to couple the amplifier to the mixer.

In another embodiment, the method further comprises forming at least one region of metallic material coupled to the mixer for contact with a testing apparatus. In one embodiment, a region of metallic material coupled to the mixer is arranged to enable the mixer to be tested independently of the amplifier.

In one embodiment, the method further includes forming a region of metallic material coupled to the mixer to enable an electrically conductive member to be connected thereto from one of the input and output of the amplifier.

In another embodiment, the method further includes forming a region of metallic material connected to one of the input and output of the amplifier and connecting an electrically conductive member thereto to couple the mixer to the selected one of the input and the output.

In another embodiment, the method further includes the step of forming a coupler for connecting the mixer to the amplifier, wherein the coupler has a first port and a second port, a first region of metallic material connected to the first port and a second region of metallic material connected to the second port, wherein the first and second regions are arranged to enable a connection to be made thereto from the amplifier. Preferably, the first region of metallic material is nearer to the input port of the amplifier than to the output port, and the second region of metallic material is nearer to the output port of the amplifier than to the input port. Advantageously, this arrangement enables a relatively short connection to be made between the amplifier and coupler both when the amplifier and mixer combination is implemented as a receiver and a transmitter.

In another embodiment, the method includes forming a first connection between the input of the amplifier and the mixer, and a second connection between the output of the amplifier and the mixer, and modifying one of the first and second connections to open the electrically conductive path formed thereby to implement the amplifier/mixer combination as a transmitter or receiver. At least one of the first and second connections may comprise an air bridge, which may be severed in order to provide the selected connection between the mixer and the selected one of the input and output of the amplifier.

Methods of forming an integrated circuit comprising an amplifier and a mixer generally involve either forming structure on the substrate which allows an electrically conductive member to be subsequently connected to the structure to selectively connect either the input or the output of the amplifier to the mixer either directly or via a coupler (e.g. 90° hybrid coupler) or preforming connections both between the input and output of the amplifier and the mixer, again either directly or via a coupler, and modifying one of the connections to isolate electrical connection between the input of the amplifier or the output of the amplifier and the mixer via the electrically conductive path provided by the preformed connection. The methods will result in various intermediate and final structures of the integrated circuit according to further aspects of the present invention, as follows.

Thus, according to a further aspect of the present invention there is provided a monolithic substrate containing an integrated circuit comprising an amplifier having an input for receiving a signal to be amplified, and an output for outputting the amplified signal, a mixer, and a pad comprising a discrete region of electrically conductive material coupled to the mixer, said pad being separated from said input and said output and formed within the boundary of the area of a die for containing said integrated circuit and for enabling said mixer to be selectively connected to one of said input and said output by forming a subsequent connection from said pad to one of said input and said output.

According to another aspect of the present invention, there is provided a substrate comprising an amplifier having an input for receiving a signal to be amplified, and an output for outputting the amplified signal, a mixer, and a coupling means for coupling the amplifier to the mixer, said coupling means including a first electrical conductor between said input and said mixer, and a second electrical conductor between said output and said mixer, wherein one of said first and second electrical conductors is modified to remove the electrically conductive path established thereby between said mixer and a respective one of said input and said output.

According to another aspect of the present invention, there is provided an integrated circuit comprising: an amplifier having a input for receiving a signal to be amplified, and an output for outputting the amplified signal, a mixer, a coupler for coupling one of said input and said output to the mixer, a first pad of metallic material connected to said coupler and a second pad of metallic material connected to one of said input and said output, said first and second pads being sized to permit an electrically conductive member to be connected thereto after the pads are formed to connect said coupler to said amplifier.

According to another aspect of the present invention, there is provided an integrated circuit comprising: an amplifier having an input for receiving a signal to be amplified, and an output for outputting the amplified signal, a mixer, a coupler for coupling the amplifier to the mixer and wherein said input and output are connected to said coupler.

According to another aspect of the present invention, there is provided an integrated circuit comprising: an amplifier having an input for receiving a signal to be amplified, and an output for outputting the amplified signal, a mixer, a coupler for coupling the amplifier to the mixer, a first electrical conductor between input and said coupler, and a second electrical conductor between said output and said coupler, and wherein one of said first and second electrical conductors is modified to remove the conductive path formed thereby between a respective one of said input and said output from said coupler.

According to another aspect of the present invention, there is provided an integrated circuit comprising: an amplifier having an input for receiving a signal to be amplified, and an output for outputting the amplified signal, a mixer, a coupler for coupling said mixer to said amplifier, and switch means for selectively connecting and disconnecting said input to said coupler.

According to another aspect of the present invention, there is provided an integrated circuit comprising: an amplifier having an input for receiving a signal to be amplified, and an output for outputting the amplified signal, a mixer, a coupler for coupling said amplifier to said mixer, and switch means for selectively connecting and disconnecting said output to said coupler.

According to another aspect of the present invention, there is provided an integrated circuit comprising: an amplifier having an input for receiving a signal to be amplified, and an output for outputting the amplified signal, a mixer, a coupler for coupling said amplifier to said mixer and having a first port and a second port, a termination, and switch means for selectively connecting and disconnecting said termination to and from one of said first and second ports.

According to another aspect of the present invention, there is provided an integrated circuit comprising: an amplifier having an input for receiving a signal to be amplified, and an output for outputting the amplified signal, a mixer, a coupler for coupling said amplifier to said mixer and having a first port and second port, a termination for connection to one of said first and second ports, and a pad of metallic material connected to said termination.

According to another aspect of the present invention, there is provided an integrated circuit comprising an amplifier for receiving a signal to be amplified, and an output for outputting the amplified signal, a mixer, a coupler for coupling said amplifier to said mixer and having a first port and a second port, a termination, a first electrical conductor between said termination and said first port and a second electrical conductor between said termination and said second port.

According to another aspect of the present invention, there is provided an integrated circuit comprising: an amplifier having an input for receiving a signal to be amplified, and an output for outputting the amplified signal, a mixer, a coupler for coupling said amplifier to said mixer and having a first port and a second port, a first termination associated with said first port and a second termination associated with said second port.

BRIEF DESCRIPTION OF THE DRAWINGS

Examples of embodiments of the present invention will now be described with reference to the drawings, in which:

FIG. 12 shows a diagram of an integrated circuit with another arrangement for coupling the amplifier and mixer, according to an embodiment of the present invention;

FIG. 13 shows a block diagram of an integrated circuit according to another embodiment of the present invention, and FIG. 14 shows a block diagram of an integrated according to another embodiment of the present invention.

DESCRIPTION OF EMBODIMENTS

Figure 1:
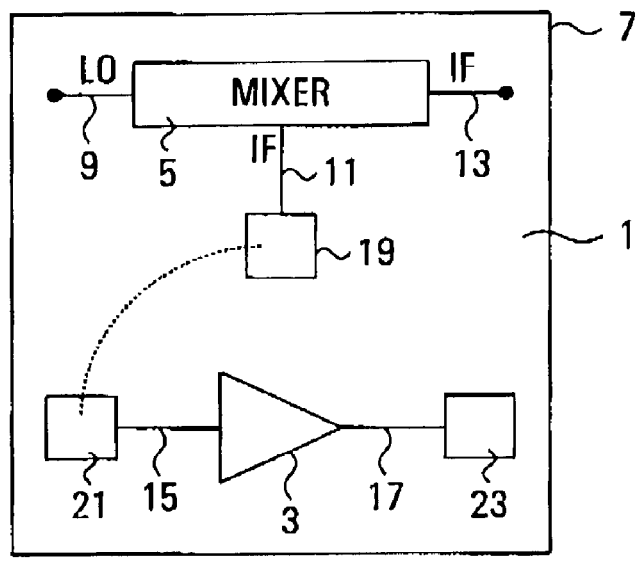
FIG. 1 shows a schematic diagram of an integrated circuit containing an amplifier and mixer according to one embodiment of the present invention.

Referring to FIG. 1, an integrated circuit 1, according to an embodiment of the present invention, comprises an amplifier 3 and a mixer 5 formed on a semi-conductor die 7. The mixer has an input port 9 for receiving a local oscillator (LO) signal, an RF input/output port 11 for receiving or outputting an RF signal, depending on whether the circuit is selected to operate as a transmitter or receiver, and an IF (Intermediate Frequency) input/output port 13 for either receiving or outputting an IF signal, again depending on the selected operating mode of the circuit. The integrated circuit 1 further includes an arrangement which enables the RF input/output port 11 of the mixer to be selectively connected to either the input port 15 or the output port 17 of the amplifier 3. In the present embodiment, the arrangement comprises a first region 19 of metallic material connected to the mixer RF port 11, a second region 21 of metallic material connected to the input 15 of the amplifier, and a third region 23 of metallic material connected to the output 17 of the amplifier. The metallic regions 19, 21, 23 provide a means of enabling the mixer RF port to be connected to either the input or the output of the amplifier, depending on the selected operating mode, and have sufficient surface area to allow an electrical conductor to be connected thereto. In one example, the electrical conductor may be wire, made of any suitable material, such as gold, one end of which is bonded to the RF mixer pad 19 and the other end to one of the amplifier input or output pads 21, 23 to form a connection between the amplifier and mixer. Any one or more of the metallic regions or pads 19, 21, 23 may also have sufficient surface area to enable contact therewith by a probe for testing the amplifier or mixer, and may permit the amplifier to be tested independently of the mixer and vice versa.

The integrated circuit may be formed using any suitable technology, an example of which is monolithic microwave integrated circuit technology, which provides the integration of transistor and passive microwave structures on a single semi-conductor wafer, usually of GaAS, although other fabrication processes may be used which employ other semi-conductor materials. An MMIC fabrication process typically involves between 10 and 20 photolithographic masks to define the geometry of all components integrated on the wafer. An example of the process flow of an MMIC fabrication process is described in J. G. Summers and L.A.N.G. Thow Hings, "An Overview of Gallium Asanide MMIC Process", GEC Journal of Research, Volume 4, Number 2, 1986, and may include some or all of the following steps.

MMIC Fabrication Process Steps
1. Active Layer Formation
2. Active Area Isolation
3. Ohmic Contact for Source/Drain and Resistor
4. Channel Etching
5. Resistor Trimming
6 First Level Metal for Gates and Capacitor
7. PECVD for Passivation and Dielectric
8. Protection Layer
9. Second Metal Level for Seeding to Plating
10. Definition and Plating of Air Bridges, Transmission Line and Interconnects
11. Substrate Thinning
12. Via Holes
13. Back Metal
14. Separating (e.g. Sawing) Wafer into Individual MMIC Dies.

The MMIC process is normally controlled by measuring material parameters throughout the process to provide repeatability of the performance parameters of individual MMIC circuits. A fabrication process may be applied to batches of for example 5 to 25 wafers, resulting in as many as 49,000 individual MMIC dies, assuming a wafer diameter of 100 mm and an individual die area of 4 mm².

Returning to the embodiment shown in FIG. 1, the metallic regions 19, 21, 23 may be formed at any suitable step or steps in the fabrication process and one or more metallic regions 19, 21, 23 may be formed at a different stage or stages to that or those in which another metallic region 19, 21, 23 is formed. The metallic contact regions may also be formed during the same process or processes used to form other metallic regions required for the formation of other components of the integrated circuit, so that the provision of the metallic interconnect regions do not increase the number of processing steps. Alternatively, one or more of the metallic interconnect regions may be formed using one or more special additional processing steps.

The interconnection scheme of the present embodiment allows the connection between the amplifier and mixer to be selected at any time during the fabrication process, or after the formation of the amplifier and mixer is complete. If the selection of the connection between the amplifier and mixer depends on the result of the fabrication process, the selection may be made at any time after completion of the process step from which the appropriate connection can be determined. Such a determination may be made, for example, by inspection or testing the physical structure formed by one or more process steps, by testing or measuring any other properties of the resulting structure, or by testing or measuring the performance or other characteristics of the resulting amplifier and/or mixer.

It is to be noted that where it is determined that a particular integrated circuit is suitable for both transmit and receive functions, the present interconnect scheme allows flexibility in selecting the appropriate connection between the amplifier and the mixer, which may be based on other considerations, such as the demand for one implementation over another.

Figure 2:
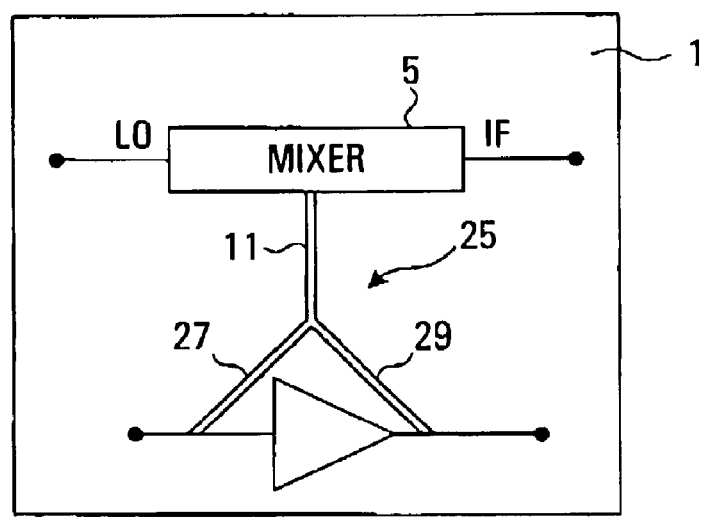
FIG. 2 shows a schematic diagram of an integrated circuit containing a mixer and amplifier according to another embodiment of the present invention.

FIG. 2 shows another embodiment of an integrated circuit having another interconnect arrangement. As for the embodiment shown in FIG. 1, the integrated circuit shown in FIG. 2 includes an amplifier 3 and a mixer 5, like parts being designated by the same reference numerals. The interconnect arrangement 25 between the amplifier and the mixer comprises a first electrical conductor 27 between the input 15 of the amplifier 3 and the mixer RF port 11 and a second electrical conductor between the output 17 of the amplifier and the mixer RF port 11. The electrical conductors 27, 29 may be formed at and by any suitable stage or stages in the fabrication process, for example during the formation of a metalization layer. Following a determination of the function (i.e. receive or transmit) of the circuit, the appropriate conductive path between the mixer and either the input or the output of the amplifier is maintained and the other electrical conductor is modified to provide an open circuit. The electrical conductor may be modified, for example by severing the conductor or otherwise disrupting its ability to provide an electrically conductive path between the mixer and the port of the amplifier which it adjoins. The electrical conductor may be severed or a portion thereof may be removed, for example, by using optical power from a laser or any other suitable technique, such as chemical etching. Advantageously, the interconnect arrangement of the embodiment of FIG. 2 allows the connection between the amplifier and mixer to be selected after fabrication of the amplifier and/or mixer is complete.

Figure 3:
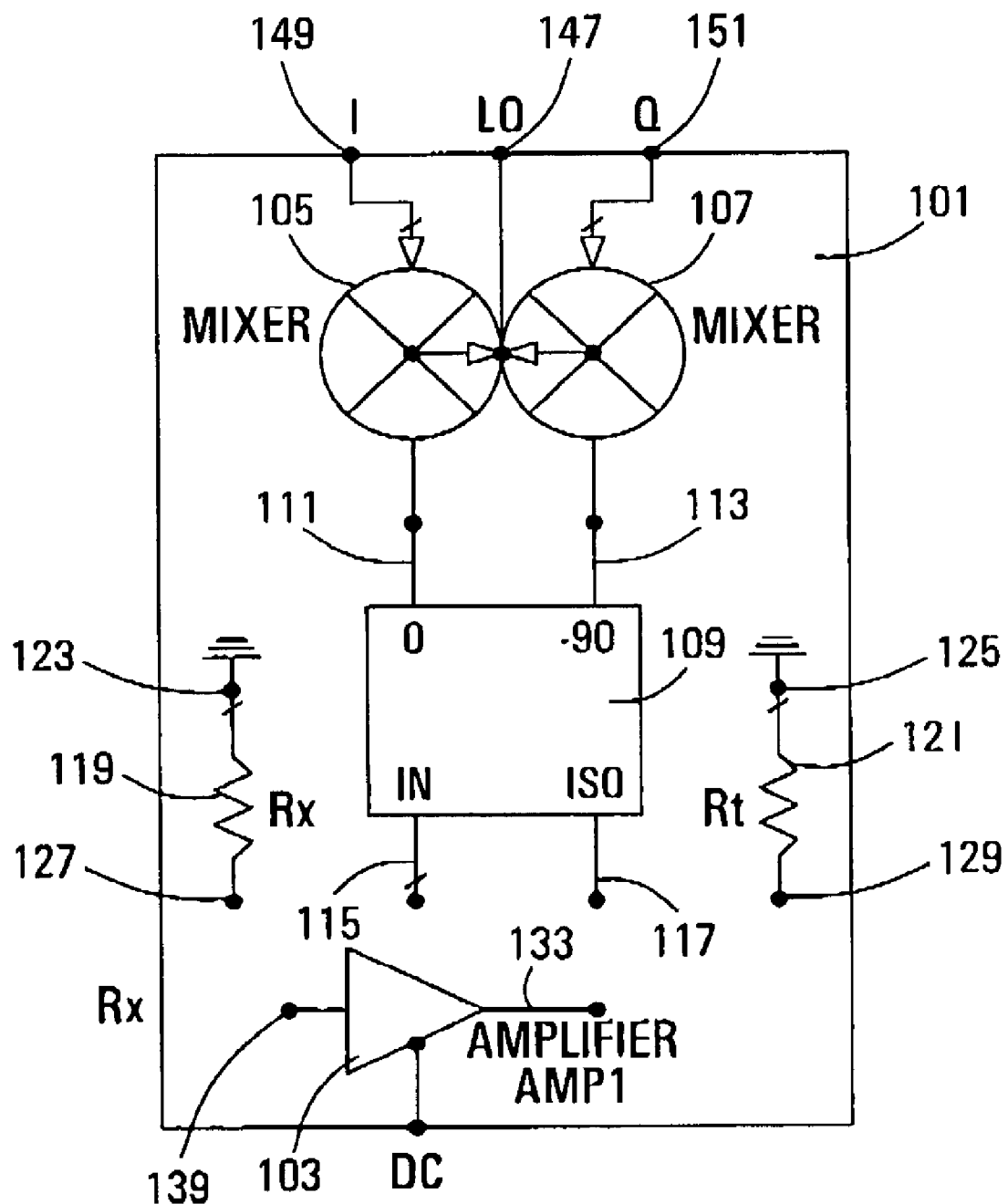
FIG. 3 shows a diagram of an integrated circuit containing a mixer and amplifier, according to another embodiment of the present invention.

FIG. 3 shows an integrated circuit according to another embodiment of the present invention. The circuit 101 includes an amplifier 103, first and second mixers 105, 107 and a coupler 109. In this embodiment, the coupler 109 comprises a 90° hybrid coupler having 4 input/output ports 111, 113, 115, 117. The first, in-phase port 111 is connected to the first mixer 105 and the second, quadrature port 113 is connected to the second mixer 107. The other two, third and fourth coupler ports 115, 117 are arranged so that either port is connectable to the amplifier 103. The circuit further includes a first impedance 119 and a second impedance 121, one end 123, 125 of each impedance being arranged for connection to ground, and the other end 127, 129 being connectable to the coupler 109. In this embodiment, the first and second impedances are each provided by a resistor and each preferably has an impedance value which matches that of the isolated coupler port, which is normally 50 Ohms for RF frequencies.

Examples of interconnection arrangements which enable the integrated circuit to function either as a receiver or a transmitter will now be described with reference to FIGS. 4 and 5, respectively.

Figure 4:
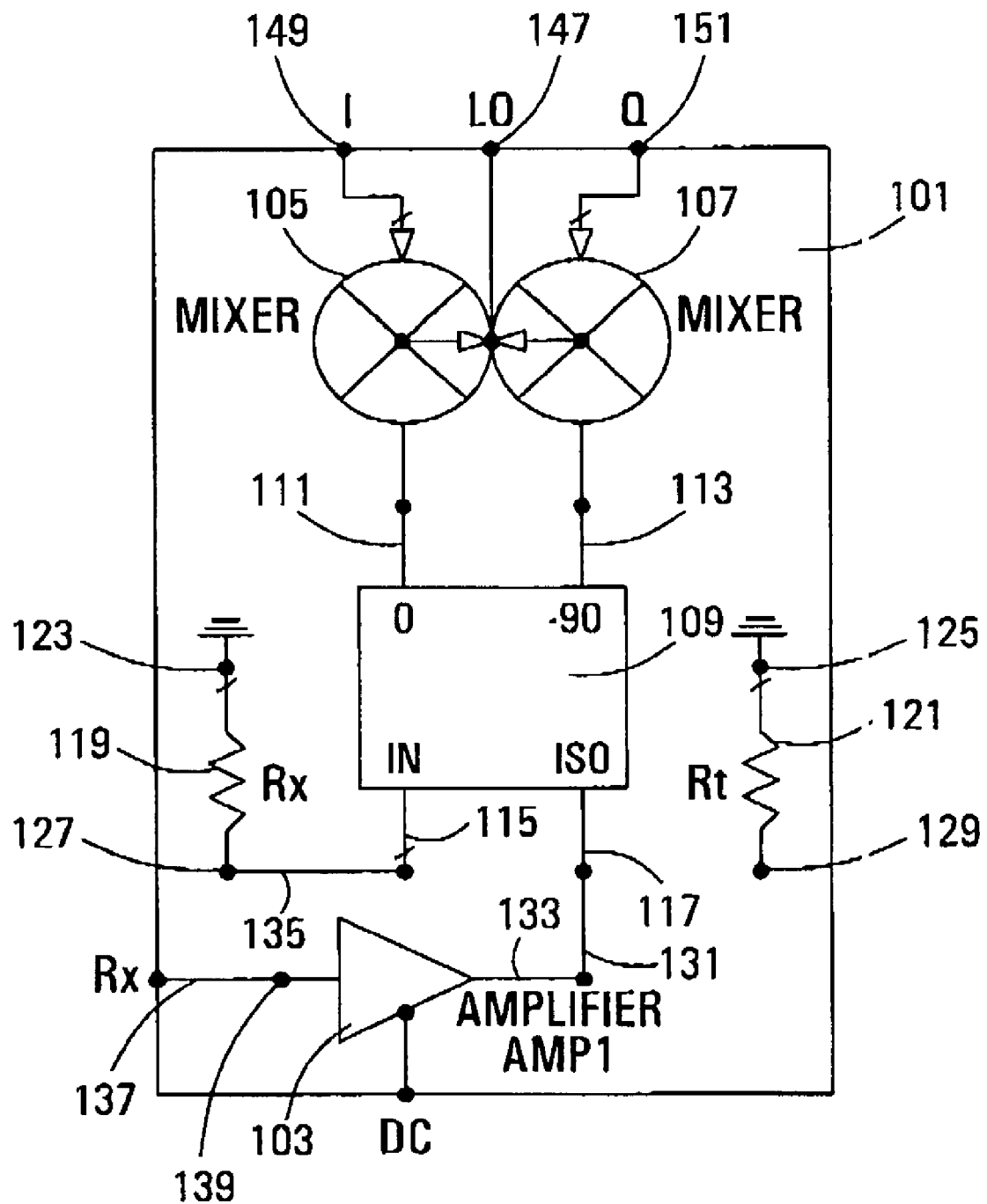
FIG. 4 shows an example of the integrated circuit shown in FIG. 3 connected to function as a receiver.

Referring to FIG. 4, connections are formed to implement the integrated circuit 101 as a receiver. A first connection is formed between the amplifier output port 133 and the coupler port 117, and a second connection 135 is formed from the first impedance 119 to the third coupler port 115. An extension 137 to the input 139 of the amplifier may also be formed, as required for subsequent coupling to a pin (not shown). In this arrangement, the fourth port 117 connected to the amplifier serves as the coupled port of the coupler 109, and the other port 115 connected to the impedance 119 serves as the isolated port. In this interconnect arrangement, no connection is made to the other impedance 121 which therefore becomes redundant.

Figure 5:
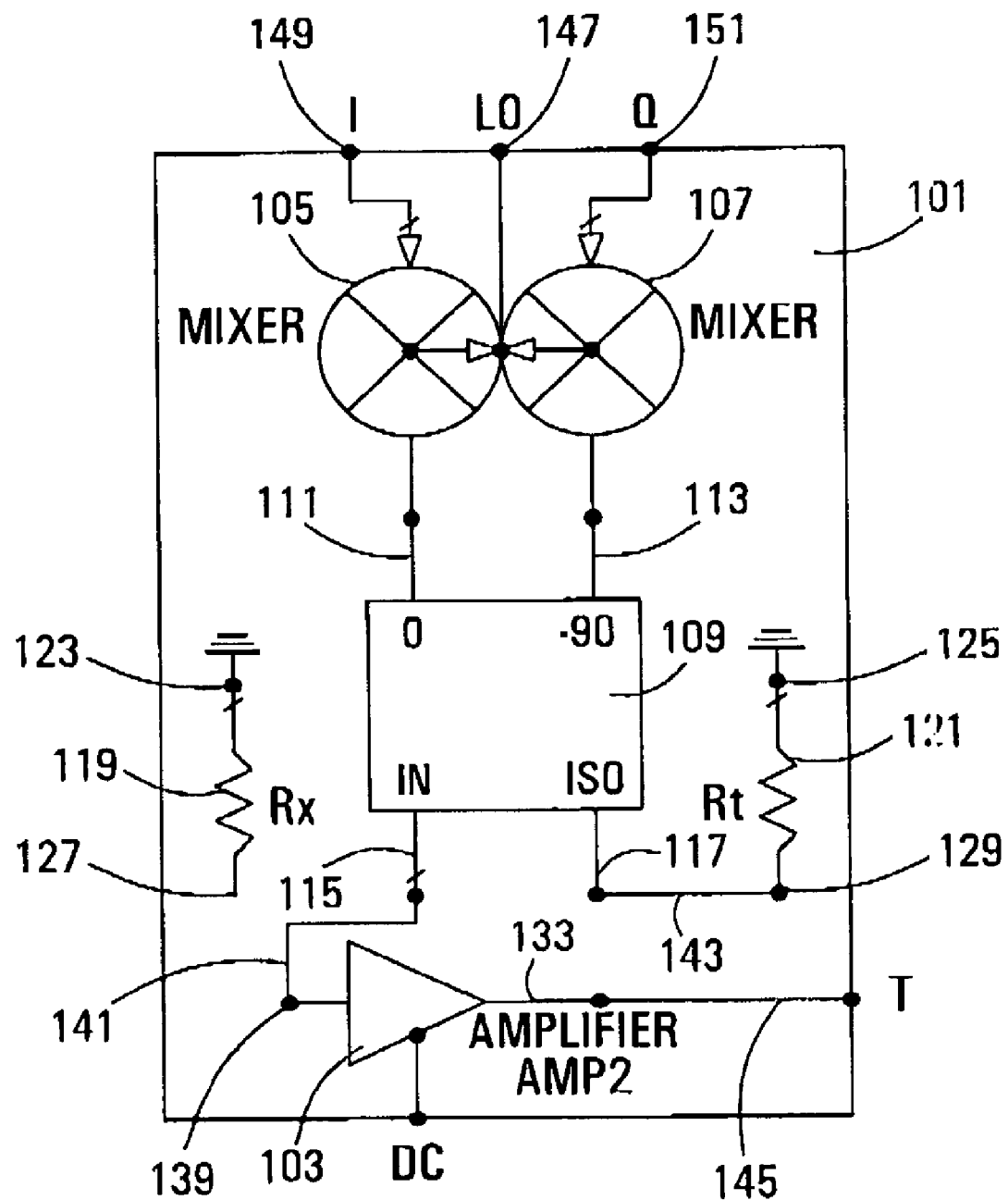
FIG. 5 shows an example of the integrated circuit shown in FIG. 3 connected to function as a transmitter.

Referring to FIG. 5, connections are formed to implement the integrated circuit as a transmitter. In this embodiment, a first connection 141 is formed between the input 139 of the amplifier 103 and the third coupler port 115, and a second connection 143 is formed from the fourth coupler port 117 to the second impedance 121. An extension 145 to the output 133 of the amplifier may be formed, as required, for example to facilitate its connection to a pin (not shown). In this arrangement, the function of the coupler ports 115, 117 is inverted relative to the receive implementation of FIG. 4, so that the third coupler port 115, connected to the input of the amplifier, serves as the coupled port, and the fourth port 117 connected to the impedance 121, serves as the isolated port. No connection is made to the first impedance 119, which is therefore redundant.

In the embodiment shown in FIGS. 3 to 5, the impedance terminal 127 of the first impedance 119 is positioned adjacent the third coupler port 115 to facilitate direct connection thereto, and similarly, the terminal 129 of the second impedance 121 is positioned adjacent to the fourth coupler port 117. Likewise, the input port 139 of the amplifier is located adjacent the third coupler port 115 and the output port 133 of the amplifier is located adjacent the fourth coupler port 117. This arrangement allows the third coupler port 115 to be connected either to the first impedance terminal 127 or to the input of the amplifier, and the fourth coupler port 117 to be connected either to the terminal 129 of the second impedance 121 or to the output of the amplifier simply and directly using short lengths of conductor, without the need to run the interconnect paths over or near other components of the circuit. However, other interconnection arrangements are also possible to implement the integrated circuit as a receiver or transmitter. For example, a receive function may be implemented by connecting the output of the amplifier to the third coupler port 115 and connecting the fourth coupler port 117 to the second impedance 121. Alternatively, a receive function may be implemented by coupling the output of the amplifier to the fourth coupler port 117, as shown in FIG. 4, but connecting the third coupler port 115 to the second impedance 121 instead of the first impedance 119. To implement a transmit function, the input port 139 of the amplifier may be connected to the fourth coupler port 117 and the third coupler port 115 connected to the first impedance 119, or the input port of the amplifier 139 may be connected to the third coupler port 115, as shown in FIG. 5, and the fourth coupler port 117 may be connected to the first impedance 119 instead of the second impedance 121.

When implemented as a receiver, an RF signal applied to the input of the amplifier is amplified and passed to the coupler which splits the RF signal into in-phase and quadrature RF signals, which may be of substantially equal amplitude, and the in-phase and quadrature RF signals are passed to the first and second mixers, respectively, for mixing with a local oscillator signal supplied to the local oscillator port 147. The resulting in-phase and quadrature intermediate frequency signals from the mixer are provided to IF output ports 149, 151, respectively.

When implemented as a transmitter, intermediate frequency in-phase and quadrature signals applied to the IF ports 149, 151, are mixed with a local oscillator signal supplied to the LO port 147 in the first and second mixers 105, 107, respectively, and the resulting in-phase and quadrature RF signals are provided to the coupler 109 in which the signals are brought in-phase, combined, and output to the input of the amplifier.

Examples of couplers which may be used to couple the amplifier to the mixer include, but are not limited to, a Lange coupler, a branch line coupler, a lumped element branch line coupler and a broad side coupler, and examples of these are described in Stephen A. Maas, "Microwave Mixers", Second Edition, Artech House 1993, pp. 249-255.

Figure 6:
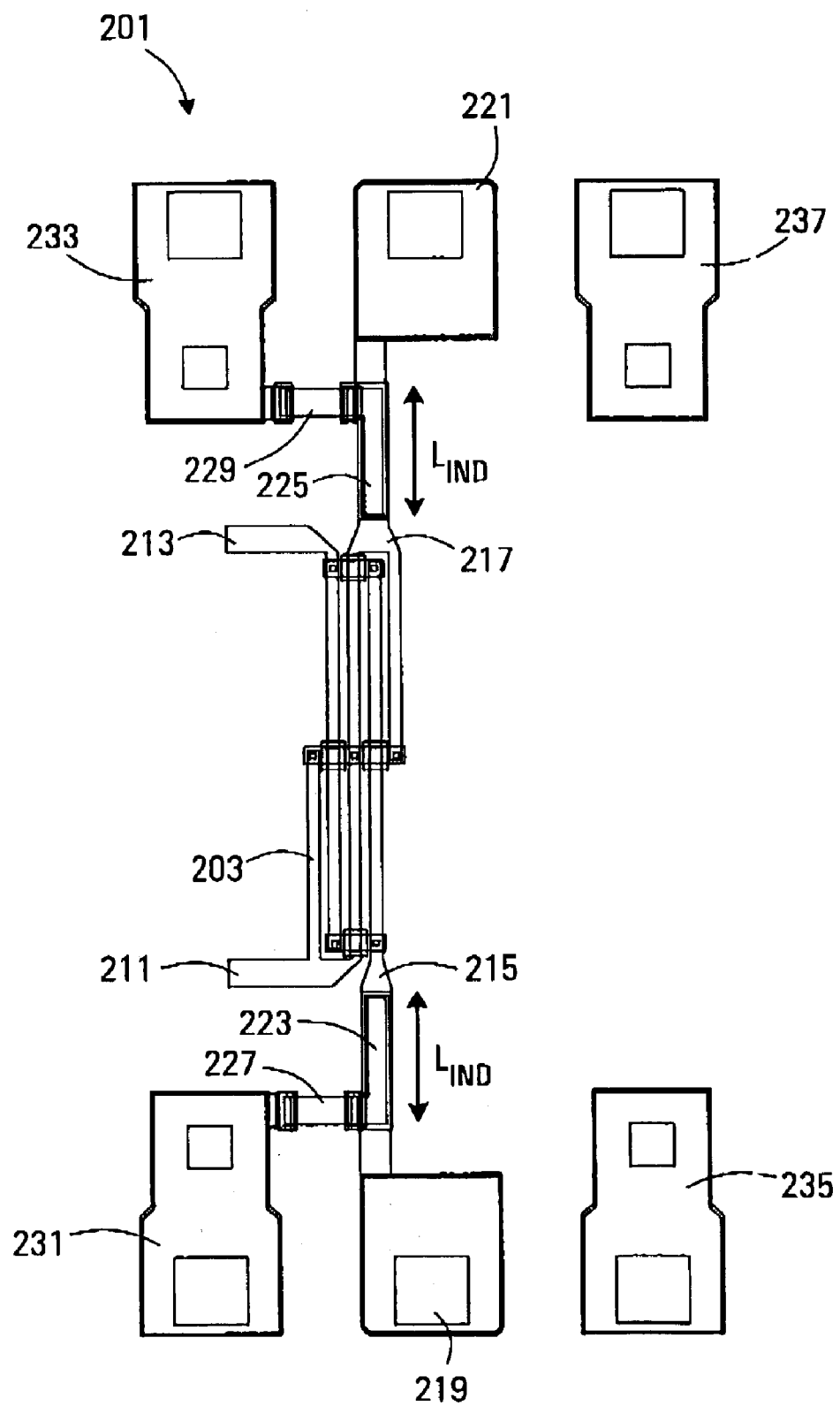
FIG. 6 shows an example of a coupler for coupling an amplifier and mixer, according to an embodiment of the present invention.

An embodiment of a coupling arrangement for enabling an amplifier to be coupled to a mixer either for receive or transmit mode is shown in FIG. 6.

The coupling arrangement 201 includes a Lange coupler 203 having first, second, third and fourth coupling ports 211, 213, 215, 217. The connection arrangement further includes first and second pads 219, 221 connected to the third and fourth coupler ports 215, 217, respectively, via an electrical conductor to 223, 225. First and second impedances 227, 229 are also connected to the third and fourth coupler ports 215, 217, respectively, via the electrical conductors 223, 225. The other end of each of the first and second impedance is connected to a respective third and fourth pad 231, 233. As will be described below, the third and fourth pads are connected to a ground plane to ground each of the impedances and to screen the first and second pads 219, 221 from other components of the circuit. Fifth and sixth pads 235, 237 positioned on the other side of the first and second pads 219, 221, also for connecting to ground, serve to screen the first and second pads from other components of the circuit.

Each of the first and second pads 219, 221 may provide a parasitic capacitance to the coupler 203 that may be detrimental to the performance of the coupler. The effect of this parasitic capacitance may be reduced or compensated by carefully selecting an appropriate length, $L_{ind}$ of electrical conductor 223, 225 between the respective coupler port 215, 217 and a respective impedance 227, 229, to provide an appropriate value of inductance.

Figure 7:
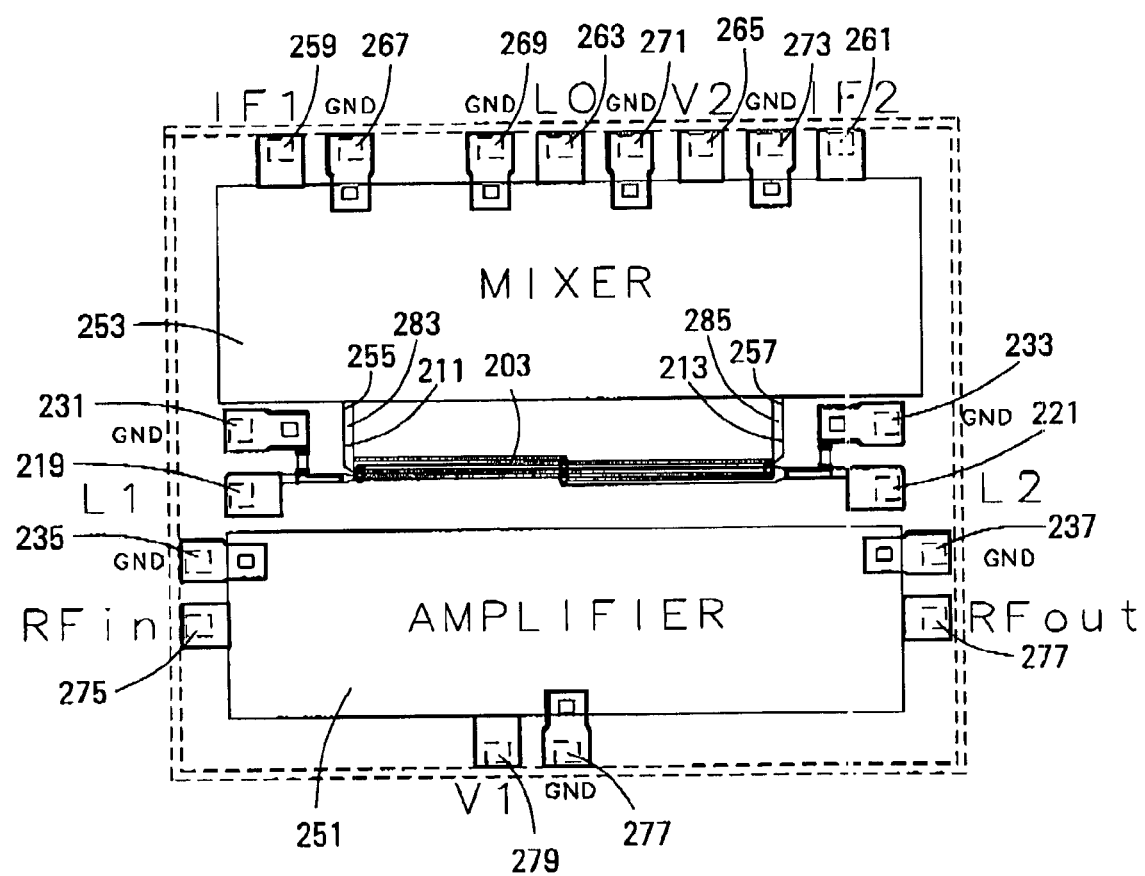
FIG. 7 shows a diagram of an integrated circuit containing a mixer and amplifier according to another embodiment of the present invention.

FIG. 7 shows an example of the coupling arrangement of FIG. 6 implemented on a die containing a mixer and amplifier. Examples of how the coupling arrangement may be used to interconnect the amplifier and mixer either for receive or transmit mode will be described below with reference to FIGS. 8 and 9, respectively.

Referring to FIG. 7, an amplifier 251 and a mixer 253 are formed by any suitable integrated circuit fabrication techniques known to those skilled in the art. In this embodiment, the mixer 253 includes first and second, phase-separated mixers (not shown), which may be similar to those shown in FIGS. 3 to 5. The mixer 253 includes a first RF port 255, coupled to the first port 211 of the Lange coupler, and a second RF port 257 connected to the second coupler port 213. The mixer 253 further includes first and second intermediate frequency (IF) input/output ports 259, 261, a local oscillator (LO) input port 263 and a DC supply input port 265, which in this embodiment, is positioned between the LO input port 263 and the second IF input/output port 261 (although in other embodiments, any other suitable configuration may be used). Ground terminals 267, 269 are provided between the first IF port 259 and the LO port 263, and further ground terminals 271, 273, are provided one being positioned between the LO port 263 and the DC supply 265, and the other being positioned between the DC supply port 265 and the second IF input/output port 261.

The amplifier includes an RF input port 275, an RF output port 277, a DC supply input port 279 and a ground terminal 281. As mentioned above, the coupler 203 is similar to that shown in FIG. 6, and like parts are designated by the same reference numerals.

Each of the impedances 227, 229, which may comprise resistors, may be formed by using integrated circuit fabrication techniques and may be formed during the same or using different process steps used to form components of the mixer and amplifier. Other components of the coupling arrangement, including the coupler 203, the connection 283, 285 from the first and second coupler port to the mixer RF ports 255, 257, the first, second, third, fourth, fifth and sixth pads 219, 221, 231, 233, 235, 237 and the electrical conductors 223, 225 connecting the first and second pads 219, 221 to the third and fourth coupler ports 215, 217, respectively, preferably comprise a metallic material and may be formed using suitable metalization processes used in integrated circuit fabrication techniques. The mixer and amplifier ports and ground terminals also comprise a metallic material and may be formed using one or more integrated circuit fabrication processes. Accordingly, all of the components of the mixer, coupling arrangement and amplifier may be formed using integrated circuit fabrication techniques, so that, for example, these techniques are used to form all of the structure of the embodiment shown in FIG. 7. An example of how this integrated circuit can be implemented to operate either in receive or transmit mode will now be described with reference to FIGS. 8 and 9.

Figure 8:
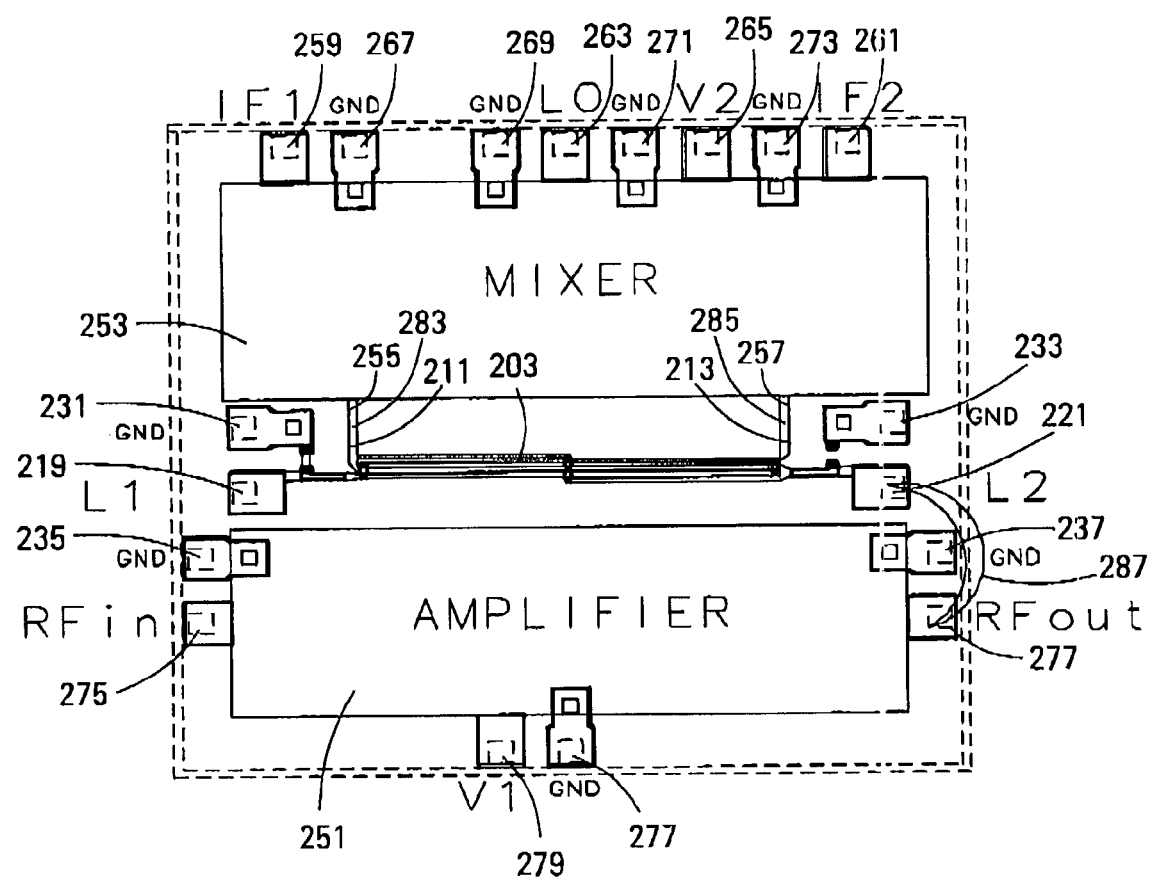
FIG. 8 shows an example of the integrated circuit shown in FIG. 7 connected to operate as a transmitter, according to an embodiment of the present invention.

Referring to FIG. 8, to implement the circuit as a receiver, a connection 287 is made between the amplifier RF output port 277 and the fourth coupler port 221. The connection 287 may be formed by any suitable technique, for example, a wire or other form of electrical conductor (preferably having a high electrical conductance) secured to the exposed metallic pads of the amplifier and coupler ports 227, 223, by any suitable bonding technique (such as ultrasonic bonding or welding, epoxy bonding or soldering, or any other suitable technique).

Although in an alternative arrangement, a connection may be formed from the amplifier RF output port to the third coupler port 219, a connection to the fourth coupler port 221 is preferred due to its proximity to the amplifier RF output port which allows a much shorter connection 287 to be used. In this case, the third coupler port 215 serves as the isolated port and therefore requires the preformed connection to the impedance 227. The preformed second impedance 229 connected to the fourth port (serving as the coupled port) is not required and should be disconnected from the fourth coupler port. Any suitable technique may be used to disconnect the fourth coupler port from this ground connection and, in one embodiment, the resistor may be burnt to create an open circuit by passing sufficient current therethrough from any suitable current source, which may, for example, be applied to the second pad 221. Other techniques such as severing the connection at a suitable location using, for example, a laser beam, may also be used. Thus, only two further modifications to the integrated circuit of FIG. 7 are required to implement the circuit as a receiver.

Figure 9:
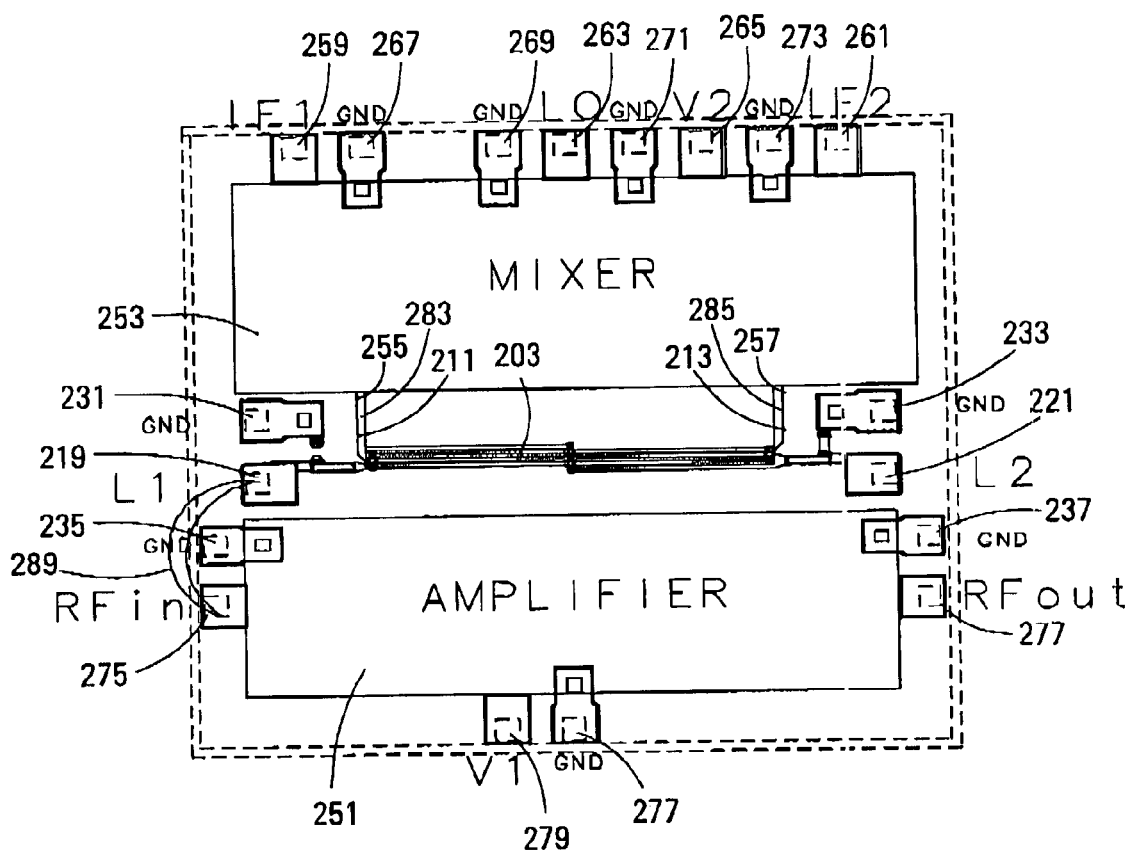
FIG. 9 shows an example of the integrated circuit shown in FIG. 7 connected to operate as a receiver, according to an embodiment of the present invention.

Referring to FIG. 9, in order to implement the circuit as a transmitter, a connection 289 is made from the amplifier RF input port 275 to the first pad 219 connected to the third coupler port 215. The connection 289 may be formed by any suitable technique and may comprise a wire or other form of electrical conductor secured to each pad 275, 219, by any suitable technique, including those described above for forming a connection 287 in the receiver implementation, shown in FIG. 8. Although, in an alternative arrangement, a connection could be formed between the RF input port of the amplifier and the second pad 221 connected to the fourth coupler port, a connection to the first pad 219 is preferred due to its proximity to the RF amplifier input port so that a much shorter length of electrical conductor can be used. In this case, the third coupler port 219 serves as the coupled port rather than as the isolated port for the receiver implementation of FIG. 8. In this case, the fourth coupler port 217 serves as the isolated port, and is already coupled to the preformed, second impedance (e.g. resistor) 229, as required. The first preformed impedance 227 is redundant and the third port should be disconnected from its preformed ground connection via the first impedance. Any suitable technique may be used to disconnect the third coupler port 215 from this ground connection, for example, by burning the impedance by passing a current therethrough, or by any other suitable technique including those described above in connection with the implementation if FIG. 8. Thus, only two further modifications are required to the basic circuit of FIG. 7 to implement the circuit as a transmitter.

Figure 10:
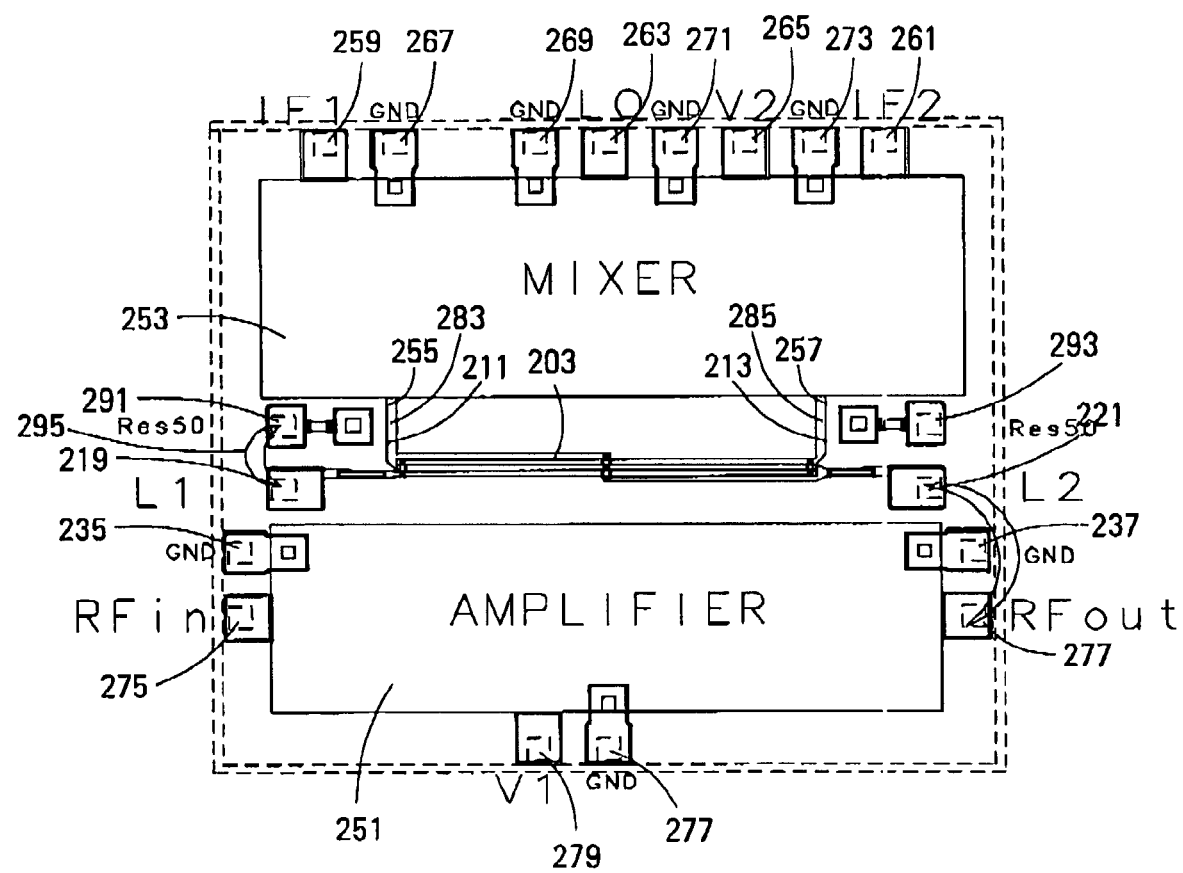
FIG. 10 shows a diagram of an integrated circuit which includes an alternative coupling arrangement for coupling the mixer and amplifier, according to an embodiment of the present invention.

FIG. 10 shows another embodiment of an integrated circuit which may be implemented either as a receiver or a transmitter. The circuit includes an amplifier, a mixer and a coupler, similar to those described above and shown in FIGS. 6 to 9, and like parts are designated by the same reference numerals.

The main difference between the embodiment shown in FIG. 10 and that shown in FIG. 7 is that in the embodiment of FIG. 10, the first and second grounded impedances 227, 229 are not preconnected to the respective third and fourth coupler ports 215, 217, but rather first and second coupling pads 291, 293 connected to a respective first and second impedance 227, 229 are provided to enable a selected third or fourth coupler port 215, 217 to be connected to one of the impedances 227, 229 after the integrated circuit has been formed. In the example shown in FIG. 10, the circuit is implemented to operate in receive mode, with a connection being formed between the RF amplifier output 277 and the second pad 221 connected to the fourth coupler port 217. In this case, the third coupler port 215 serves as the isolated port and may be conveniently connected to the closely located first impedance 227. In the present arrangement, a connection 295 is made between the first pad 219 and the first impedance coupling pad 291. The connection 295 may comprise any suitable electrical conductor, and may be secured to the pads 219, 291 by any suitable technique. For example, the connection 295 may comprise a wire, preferably of highly conductive material such as gold, and may be secured to the pads using any suitable bonding technique, such as ultrasonic bonding or welding, epoxy bonding or soldering, as well as other techniques.

Although, in an alternative arrangement, the third coupler port 215 may be coupled to the second impedance 293, connecting the third coupler port to the first impedance 227 is preferred due to their proximity and therefore the relatively short connection required.

It will be appreciated that the basic integrated circuit of FIG. 10 can be readily implemented as a transmitter circuit by forming a connection between the amplifier RF input 275 and the first pad 219 connected to the third coupler port 215, and by forming a connection between the second pad 221, connected to the fourth coupler port 217, and the second impedance coupling pad 293. Again, these connections may be formed using any suitable electrical conductor and secured to the pads using any suitable technique.

Figure 11:
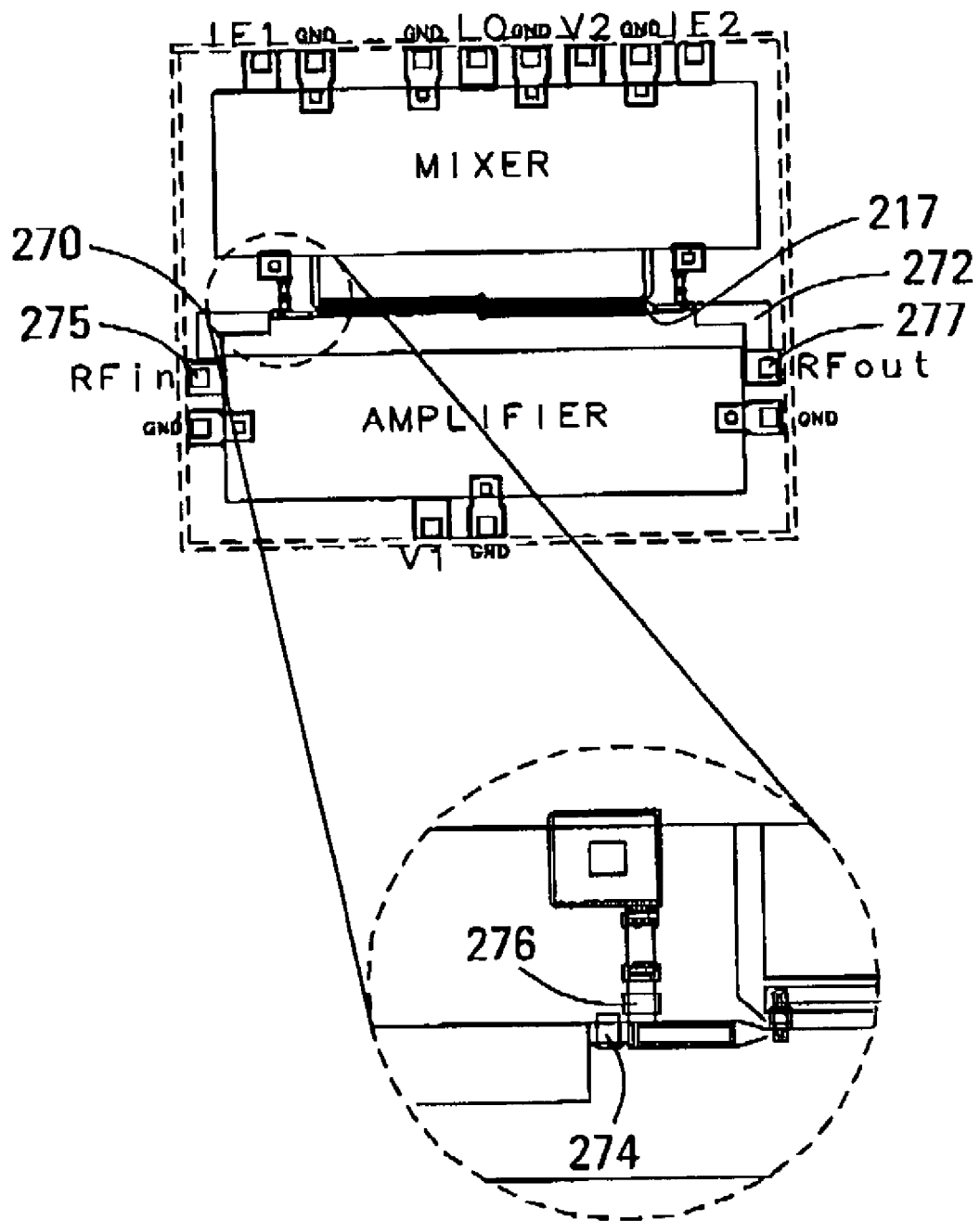
FIG. 11 shows a diagram of an integrated circuit with another coupling arrangement for coupling the amplifier and mixer, according to another embodiment of the present invention.

In another embodiment of the integrated circuit, a connection may be preformed between one of the coupler ports and the RF amplifier input, and another connection preformed between the other coupler port and the RF amplifier output. The integrated circuit may then be implemented either as a receiver or transmitter by retaining one of the connections and severing the other. An example of an integrated circuit having preformed connections between the coupler and both the amplifier input and output is shown in FIG. 11. The integrated circuit 201 includes an amplifier 251, a mixer 253 and a coupler 203. The integrated circuit is similar to those shown in FIGS. 7 to 10, and like parts are designated by the same reference numerals. In this embodiment, a first electrical conductor 270 is formed between the third coupler port 215 and the amplifier RF input 275, and a second electrical conductor 272 is formed between the fourth coupler port 217 and the amplifier RF output 277. In this embodiment, the first impedance is preconnected to the third coupler port and the second impedance is preconnected to the fourth coupler port 217. As can be seen most clearly from the enlarged view of FIG. 11, a portion of the first and second electrical conductors 270, 272 includes an air bridge 274 shown by the small rectangular region. The electrical connection between the impedances and the respective third and fourth coupler ports also includes an air bridge 276, again illustrated by a small rectangular region.

As for the embodiments of FIGS. 6 to 9, the third and fourth coupler ports may include an extension 223, 225, to which both air bridges 274 and 276 are connected. The extension is sized to provide a value of inductance that compensates for the effect of parasitic capacitance on the characteristics of the Lange coupler.

In order to implement the integrated circuit of FIG. 11 as a receiver, the preformed electrical conductor between the RF input of the amplifier and the third coupler port may be severed to form an open circuit. This may readily be achieved by severing the air bridge 274, and optionally lifting or bending one or more of the severed ends away from the other. In this implementation, the third coupler port acts as the isolated port and therefore its connection to the first impedance is retained. The preformed connection between the fourth coupler port 217 and the amplifier RF output 277 is also retained, and the connection between the fourth coupler port 217 and the second impedance severed, which again may be conveniently achieved by severing the air bridge 276 and optionally lifting or bending one or more of the severed ends away from the other.

To implement the integrated circuit as a transmitter, the third coupler port 215 serves as the coupled port, and in this case the preformed connection between the RF amplifier input 275 and the third coupler port is retained, and the connection between the third coupler port and the first impedance severed, for example, by severing the air bridge. The preformed connection between the amplifier RF output 277 and the fourth coupler port 217 is severed, for example, at the air bridge 274 and one or more of the severed ends may be bent away from the other. In this transmitter configuration, the fourth coupler port 217 serves as the isolated port, and therefore the preformed connection between this port and the second impedance is retained.

As can be appreciated from the above description, the integrated circuit of FIG. 11 may be implemented either as a receiver or a transmitter simply by severing the appropriate two preformed connections. The preformed connections between the amplifier and coupler and the coupler and the impedances may be formed by any suitable process, for example using one or more of the same metallization processes used to form other components of the integrated circuit. Although in the embodiment shown in FIG. 11, these preformed connections include air bridges to facilitate severing the connections, in other embodiment, one or more or all of the air bridges may be omitted (and replaced by connections supported by the substrate). The preformed connections may be severed using any suitable technique, including a cleaving tool such as a blade, a laser beam or by etching.

Although the preformed electrical conductors may be severed at any position between the junction at which it meets the impedance connection and the amplifier port to which it is coupled, it may be preferable to sever the electrical conductor at a position close to the junction to reduce the area of conductor that extends beyond the junction which may otherwise affect the performance of the coupler.

According to another embodiment of the present invention, the interconnect between the mixer or coupler can be selected after one or more processing steps used to fabricate the amplifier and mixer has been completed, and the selected connection can be formed during one or more further process steps, for example during the formation of one of the metallization layers. For example, a suitable point at which the process may be stopped to select the functionality of the circuit may be after the protection layer has been formed. Since the protection layer provides protection for the components formed to this point, it is usually possible to stock these wafers for a few months and the wafers may therefore be split into different lots and temporarily stored. Information about the control parameters defining the performance of the circuit or circuit elements, such as one or more transistors, are also available and will assist in narrowing down the expected performance of the MMIC. A decision can therefore be made at that time to form a receiver MMIC or a transmitter MMIC. In one embodiment, only one additional mask defining the geometry of the metal level is needed to complete the process. For example, the additional mask defines the appropriate connection between the amplifier input/output port and the mixer or coupler, and if appropriate, the connection between the isolated coupler port and an impedance, although in other embodiments, a connection between both ports may be made to an impedance and the connection later severed or the impedance (e.g. resistor) burnt or otherwise its connection to ground made open circuit.

In another embodiment of the present invention, a solid state switch may be incorporated which can be controlled to selectively connect one of the input and the output of the amplifier to the mixer. If a coupler is incorporated between the amplifier and mixer, and the coupler has one port that serves as the coupled port, and another port that serves as an isolated port, two solid state switches may be used to selectively couple one of the input and the output of the amplifier to one of the coupler ports. An example of the latter embodiment is shown in FIG. 12. FIG. 12 shows an integrated circuit die having an amplifier 251, a mixer 253 and a coupler 203. The coupler has first, second, third and fourth ports 211, 213, 215, 217, of which the first and second ports are coupled to the mixer 253. A first switch 291 is coupled to the third coupler port 215, and a second switch 293 is connected to the fourth port 217. The switches are arranged such that in a first state, the first switch 291 couples the third port 215 to the first impedance 119, and the second switch 293 couples the fourth port 217 to the output of the amplifier. In this state, the circuit is configured as a receiver.

The switches also have a second state, in which the first switch 291 couples the third coupler port 215 to input 275 of the amplifier, and the second switch 293 couples the fourth coupler port 217 to the second impedance 121. Thus, in the second state, the circuit is configured to operate as a transmitter. The first and second switches may comprise any suitable switches which can perform the desired function. For example, the switches may comprise absorbtive single pole double throw switches. The state of the switches may be selected and fixed permanently, or otherwise the switches may be switched between the first and second states over time to implement the desired function. For example, the state of the switches may be changed on a frequent basis to enable the receive and transmit functions to be time division multiplexed.

Although in some embodiments, two separate impedances can be provided, one for connection to the selected isolated port of the coupler, another embodiment may include a single impedance that may be connected to the selected isolated coupler port. For example, the impedance may have a terminal located between the third and fourth coupler ports to which either coupler port may be connected. An example of this embodiment is shown in FIG. 13. An integrated circuit substrate having a die area 201 comprises an amplifier 251, a coupler 203 and a mixer 253. The first and second ports 211, 213 of the coupler are coupled to the mixer. An impedance 224 is formed between the third and fourth coupler ports 215, 217 and may have a terminal which enables the impedance to be connected to one of the third and fourth coupler ports, depending on which is to function as an isolated port. Alternatively, a connection between the impedance terminal and both third and fourth coupler ports may be preformed, and one of the connections later modified to disconnect one of the coupler ports from the impedance terminal.

In another embodiment, an example of which is shown in FIG. 14, the impedance may comprise a resistor 226, each end of which is connected to a terminal, each terminal being located adjacent a respective third and fourth coupler port 215, 217. Two further terminals which enable the resistor 226 to be grounded, may also be provided, preferably adjacent a respective a resistor terminal. An appropriate connection to the resistor 226 can be formed by connecting the isolated coupler port to one of the resistor terminals and the other resistor terminal to the ground terminal.

It is to be noted that in other embodiments, the interconnect scheme provided for coupling the input of the amplifier to the mixer or coupler can be different from the interconnect scheme provided for coupling the output of the amplifier to the mixer or coupler.

In other embodiments, where a coupler is employed, the coupler need not be formed on the MMIC chip, but may be formed on a different substrate, for example a Printed Circuit Board (PCB), and the MMIC die may be mounted on the board so that the mixer and amplifier are appropriately connected. The or each impedance may also be formed on a different substrate.

Although the coupler port termination(s) may comprise resistor(s), the desired impedance may also be provided by other circuit elements or combinations of circuit elements, and may for example comprise an LC-circuit. However, since the impedance of such a circuit is frequency dependent, using such an impedance may limit the frequencies for which the amplifier/mixer circuit can be used.

Although, in embodiments of the invention, metallic pads are provided to facilitate subsequent connection between either the input or output of the amplifier and the mixer (or coupler), in other embodiments, the discrete region of metallic material, which allows subsequent connection, may have any other suitable form and may not have an enlarged surface area relative to port from which it extends or the conductive connecting member which subsequently connects the amplifier to the mixer. For example, the discrete region may simply comprise an end of a strip of metallic conductor from the port of the coupler or the amplifier or the input/output port(s) of the mixer.

Modifications and changes to the embodiments described above will be apparent to those skilled in the art.

The invention claimed is:

1. A monolithic substrate containing an integrated circuit, the integrated circuit comprising an amplifier, a mixer and at least a first pad, the amplifier having an input for receiving a signal to be amplified, and an output for outputting the amplified signal, the amplifier and mixer being configurable during manufacture of the integrated circuit to function in a first mode in which the first pad is connected to the input of the amplifier, and a second mode in which the first pad is connected to the output of the amplifier, both the input and the output of the amplifier being accessible during manufacture of the integrated circuit for connection to the first pad, the first pad comprising a discrete region of electrically conductive material coupled to the mixer and having a sufficient surface area for contact with a test probe, said first pad being separated from said input and said output and formed within the boundary of the area of a die for containing said integrated circuit and for enabling, in the manufacture of said integrated circuit, said mixer to be selectively connected either to said input or to said output by fabricating a subsequent connection from said first pad to one of said input and said output, and an electrically conductive member forming said subsequent connection and extending from said input or said output and secured to said first pad.

2. The monolithic substrate as claimed in claim 1, further comprising a second pad comprising a discrete region of electrically conductive material formed within the boundary of said die area and separated from the first pad, said second pad being coupled to one of said input and said output and for enabling a connection to be made thereto from said first pad.

3. The monolithic substrate as claimed in claim 2, wherein said electrically conductive member connects said first pad to said second pad.

4. The monolithic substrate as claimed in claim 2, wherein said second pad is coupled to said input and further comprising a third pad comprising a discrete region of electrically conductive material coupled to said output, said third pad being formed within the boundary of said die area and separated from said first pad, and for enabling a connection to be formed thereto from said first pad.

5. The monolithic substrate as claimed in claim 4, wherein said electrically conductive member connects said first pad to one of said second and third pads.

6. The monolithic substrate as claimed in claim 2, wherein said second pad has a sufficient surface area for contact with a test probe.

7. The monolithic substrate as claimed in claim 4, wherein said third pad has a sufficient surface area for contact with a test probe.

8. The monolithic substrate as claimed in claim 3, wherein said electrically conductive member comprises one of a layer of electrically conductive material formed on said substrate and a wire.

9. The monolithic substrate as claimed in claim 3, wherein said electrically conductive member comprises a wire bonded to at least one of said first and second pads.

10. An integrated circuit formed on a monolithic substrate comprising:

an amplifier having a input for receiving a signal to be amplified, and an output for outputting the amplified signal, a mixer, a coupler connected to said mixer for coupling one of said input and said output to the mixer, said amplifier and mixer being configurable during manufacture of the integrated circuit to function in a first mode in which the mixer is coupled by the coupler to the input of the amplifier and in a second mode, in which the mixer is coupled by the coupler to the output of the amplifier, both the input and the output of the amplifier being accessible during manufacture of the integrated circuit for connection to the coupler to enable the function of the amplifier and mixer as between the first and second modes to be freely selected during manufacture of the integrated circuit, a first pad of metallic material connected to said coupler and a second pad of metallic material connected to one of said input and said output, said first and second pads having a sufficient surface area for contact with a test probe and being sized to permit an electrically conductive member to be connected thereto during manufacture of said integrated circuit to connect said coupler to said amplifier, the integrated circuit further comprising the electrically conductive member connected between said first and second pads.

11. The integrated circuit as claimed in claim 10, wherein said electrical conductor is bonded to at least one of said first and second pads.

12. The integrated circuit as claimed in claim 11, wherein said electrical conductor comprises one of a wire and a layer of electrically conductive material.

13. The integrated circuit as claimed in claim 10, further comprising a third pad of metallic material connected to the other of said input and said output.

14. The integrated circuit as claimed in claim 10, wherein said electrical conductor is bonded to at least one of said first and second pads.

15. The integrated circuit as claimed in claim 13, further comprising a fourth pad of electrically conductive material, and wherein said coupler includes a first port coupled to said first pad and a second port coupled to said fourth pad.

16. The integrated circuit as claimed in claim 15, wherein said fourth pad is positioned closer to said third pad than to said second pad.

17. The integrated circuit as claimed in claim 16, wherein said fourth pad is positioned adjacent said third pad.

18. The integrated circuit as claimed in claim 13, wherein said first pad is positioned nearer said second pad than to said third pad.

19. The integrated circuit as claimed in claim 18, wherein said first pad is positioned adjacent said second pad.

20. The integrated circuit as claimed in claim 10, wherein said coupler includes a first port connected to said first pad, a second port, and a port termination for connection to at least one of said first and second ports.

21. The integrated circuit as claimed in claim 20, comprising a further pad of metallic material connected to said port termination.

22. The integrated circuit as claimed in claim 21, further comprising a fourth pad of metallic material connected to said second port.

23. The integrated circuit as claimed in claim 22, comprising an electrical conductor connected between said further pad and one of said first and fourth pads.

24. The integrated circuit as claimed in claim 23, further comprising a first electrical conductor between said port termination and said first port and a second electrical conductor between said port termination and said second port.

25. The integrated circuit as claimed in claim 24, wherein one of said first and second electrical conductors is modified to isolate said port termination from a respective one of said first and second ports.

26. The integrated circuit as claimed in claim 10, wherein said coupler includes a first port and a second port, and further comprising a first port termination for connection to said first port and a second port termination for connection to said second port.

27. The integrated circuit as claimed in claim 26, wherein at least one of said first and second port terminations is connected to a respective one of said first and second ports.

28. The integrated circuit as claimed in claim 27, further comprising an electrical conductor extending between said at least one of said first and second port terminations and a respective one of said first and second ports.

29. The integrated circuit as claimed in claim 28, wherein the electrical conductor comprises one of a wire and an air bridge.

30. The integrated circuit as claimed in 26, comprising a first electrical conductor between said first port termination and said first port and a second electrical conductor between said second port termination and said second port, and wherein one of said first and second electrical conductors is modified to isolate one of said first and second ports from a respective one of said first and second port terminations.

31. The integrated circuit as claimed in claim 26, further comprising a first electrical conductor between said first port termination and said first port and a second electrical conductor between said second port termination and said second port, and wherein one of said first and second terminations is modified to increase its electrical impedance relative to the other one of said first and second port terminations.

32. The integrated circuit as claimed in claim 26, comprising a further pad of metallic material connected to one of said first and second port terminations.

33. The integrated circuit as claimed in claim 26, wherein at least one of said first and second port terminations comprises means for providing an impedance.

34. The integrated circuit as claimed in claim 32, further comprising an electrical conductor between said first pad and said further pad.

35. The integrated circuit as claimed in claim 26, further comprising a first additional pad of metallic material connected to said first port termination and a second additional pad of metallic material connected to said second port termination.

36. The integrated circuit as claimed in claim 35, wherein said first pad is connected to said first port, and further comprising another pad of metallic material connected to said second port.

37. The integrated circuit as claimed in claim 36, further comprising an electrical conductor connected between one of said first pad and said other pad and one of said first and second additional pads.

38. The integrated circuit as claimed in claim 26, wherein said first port termination is closer to said first port than to said second port.

39. The integrated circuit as claimed in claim 26, wherein said second termination is closer to said second port than to said first port.

40. The integrated circuit as claimed in claim 26, wherein said first port termination is positioned adjacent said first port and said second port termination is positioned adjacent said second port.

41. The integrated circuit as claimed in claim 26, comprising an electrical conductor connecting said first pad to one of said first and second ports, and wherein the length of said electrical conductor between one of said first and second ports and said first pad is selected to provide a value of inductance between said one of said first and second ports and said first pad such as to reduce the effect on said coupler of the capacitance provided by said first pad.

42. The integrated circuit as claimed in claim 10, formed on a die, and wherein said first and second pads are disposed within the boundary of said die.

43. A method of preparing a monolithic integrated circuit substrate for providing a connection between an amplifier at least partially formed thereon and a mixer at least partially formed thereon, comprising forming at least a first pad comprising a discrete region of electrically conductive material coupled to said at least partially formed mixer, forming an input and an output of the amplifier that are both accessible for connection to said first pad to enable the amplifier and mixer to be configurable during manufacture of the integrated circuit to function in a first mode in which the mixer is coupled by the first pad to the input of the amplifier and in a second mode in which the mixer is coupled by the first pad to the output of the amplifier, said first pad having a sufficient surface area for contact with a test probe, and being separated from the input and the output of said at least partially formed amplifier, and formed within the boundary of a die area containing said amplifier and mixer, said first pad enabling, in the manufacture of said integrated circuit, said mixer to be selectively connected either to said input or to said output by fabricating a subsequent connection from said first pad to one of said input and said output based on a selection between said first and second modes after manufacture of the integrated circuit has begun.

44. The method as claimed in claim 43, further comprising forming a second pad comprising a discrete region of electrically conductive material coupled to one of said input and said output, and for enabling a connection to be made thereto from said first pad.

45. The method as claimed in claim 44, wherein said second pad is coupled to said input, and further comprising forming a third pad comprising a discrete region of electrically conductive material coupled to said output, and for enabling a connection to be made thereto from said first pad.

46. The method as claimed in claim 43, further comprising forming a coupler for coupling said amplifier to said mixer, said coupler having a first port and a second port, and coupling said first pad to said first port.

47. The method as claimed in claim 46, further comprising forming a further pad comprising a discrete region of electrically conductive material coupled to said second port for enabling a connection to be made thereto from said input or said output.

48. The method as claimed in claim 43, further comprising forming a connection from said mixer to at least one of said input and said output.

49. A method of fabricating a coupling between an amplifier and a mixer, both the amplifier and mixer being at least partially formed on the same monolithic substrate, the method comprising the steps of:

forming a pad comprising a discrete region of electrically conductive material coupled to said at least partially formed mixer, the pad having a sufficient surface area for contact with a test probe, forming an input and an output of the amplifier that are both accessible for connection to said pad to enable the function of the amplifier and mixer to be configurable during manufacture of the integrated circuit between a first function in which the pad is connected to the input of the amplifier and a second function in which the pad is connected to the output of the amplifier, said pad being separated from the input and the output of said at least partially formed amplifier, and formed within the boundary of a die area containing said amplifier and mixer;

only after at least one of the amplifier and mixer has been at least partially formed, making a definitive selection of one of the first function and the second function for a combination of said amplifier and mixer, and fabricating, during a manufacture of a circuit containing said amplifier and mixer, a connection from said discrete region to one of the input and the output of said amplifier, according to the definitive selection.

50. The method as claimed in claim 49, further comprising the step of determining one of the first function and the second function for said combination based on the structure resulting from the process in which at least one of the mixer and amplifier is at least partially formed, and making said definitive selection based on a result of said determining.

51. The method as claimed in claim 49, further comprising testing at least one of said mixer and said amplifier and making said definitive selection of one of the first function and the second function for said combination based on the results of said testing.

52. The method as claimed in claim 49, further comprising forming a second pad comprising a discrete region of electrically conductive material coupled to said input and forming an electrical connection between the first discrete region and said second discrete region.

53. The method as claimed in claim 49, further comprising forming a further pad comprising a discrete region of electrically conductive material coupled to said output, and forming an electrical connection from said further pad to said pad comprising a discrete region of electrically conductive material coupled to said at least partially formed mixer.

54. A method of fabricating a coupling between an amplifier and a mixer at least partially formed on the same monolithic substrate, comprising the steps of forming a coupler for coupling said amplifier to said mixer, said coupler having a first port and a second port; forming a first pad comprising a discrete region of electrically conductive material coupled to said first port, and forming a second pad comprising a discrete region of electrically conductive material coupled to said second port, the first and second pads each having a surface area sufficient for contact with a test probe, forming an input and an output of the amplifier, the input being accessible for connection to the first pad and the output being accessible for connection to the second pad to enable the function of the amplifier and mixer to be configurable during manufacture between a first function in which the input is connected to the first pad and a second function in which the output is connected to the second pad;

only after at least one of the amplifier and mixer has been at least partially formed, making a definitive selection of one of the first and second function for a combination of said amplifier and mixer, and fabricating, during manufacture of a circuit containing said amplifier and mixer, a connection from one of said first and second pads to one of the input and the output of said amplifier based on the definitive selection of one of said first function and said second function.

55. The method as claimed in claim 54, further comprising the step of determining one of the first function and the second function for said combination based on a structure resulting from a process used to form at least one of said amplifier, said mixer, and said coupler, and making said definitive selection based on a result of said determining.

56. The method as claimed in claim 54, further comprising testing at least one said amplifier, said coupler and said mixer, and forming said connection between said coupler and said amplifier based on a result of said testing.

57. The method as claimed in claim 54, further comprising forming said first pad closer to said input than to said second pad.

58. The method as claimed in claim 54, further comprising forming said second pad closer to said output than to said first pad.

59. The method as claimed in claim 54, further comprising forming a port termination for said coupler and implementing a connection from said port termination to a selected one of the first and second ports, the pad of the selected port not being connected to said amplifier.

60. The method as claimed in claim 54, further comprising forming first and second port terminations for said coupler, and wherein said first port termination is closer to said first port than to said second port, and said second port termination is closer to said second port than to said first port.

61. The method as claimed in claim 60, comprising forming a connection from one of said first and second port terminations to a respective selected one of said first and second ports, the pad of the selected port not being connected to said amplifier.

62. The method as claimed in claim 60, comprising forming a first connection between said first port termination and said first port and forming a second connection between second port termination and said second port, and breaking one of said first and second connections.

63. The method as claimed in claim 60, comprising rendering the impedance of one of said first and second port terminations higher than the impedance of the other of said first and second port terminations.

64. The method as claimed in claim 60, wherein said first and second port terminations comprises an impedance means.

65. The method as claimed in claim 64 wherein said impedance means comprises resistance means.

66. A method of manufacturing an amplifier and a mixer combination, comprising the steps of:
   (a) at least partially forming the amplifier and the mixer in an integrated circuit on the same monolithic substrate within the area of a die for containing the integrated circuit,
   (b) after said at least partially forming and during manufacture of said amplifier and mixer combination, evaluating at least one of the at least partially formed amplifier and the at least partially formed mixer formed in step (a) to determine the suitability of the combination for one of a receive function and a transmit function
   (c) determining one of the receive function and the transmit function for the combination based on the evaluation in step (b), and
   (d) during manufacture of said combination, coupling said mixer to one of an input and an output of said amplifier based on a result of the determining in step (c).

67. The method as claimed in claim 66, further comprising the step of forming a pad of electrically conductive material coupled to said mixer to enable said mixer to be tested independently of said amplifier before said determining.

* * * * *